(12) United States Patent
Maor

(10) Patent No.: US 9,661,554 B2
(45) Date of Patent: May 23, 2017

(54) PROXIMITY DETECTION

(71) Applicant: Wise-Sec Ltd., Yokneam (IL)

(72) Inventor: Vadim Maor, Kiryat-Tivon (IL)

(73) Assignee: Wise-Sec Ltd., Yokneam (IL)

( * ) Notice: Subject to any disclaimer, the term of this patent is extended or adjusted under 35 U.S.C. 154(b) by 0 days.

(21) Appl. No.: 14/769,123

(22) PCT Filed: Feb. 18, 2014

(86) PCT No.: PCT/IL2014/050180
§ 371 (c)(1),
(2) Date: Aug. 20, 2015

(87) PCT Pub. No.: WO2014/128703
PCT Pub. Date: Aug. 28, 2014

(65) Prior Publication Data
US 2016/0007270 A1    Jan. 7, 2016

Related U.S. Application Data

(60) Provisional application No. 61/767,273, filed on Feb. 21, 2013.

(51) Int. Cl.
*H04W 4/00* (2009.01)
*H04W 48/08* (2009.01)
(Continued)

(52) U.S. Cl.
CPC ............ *H04W 48/08* (2013.01); *G01B 7/003* (2013.01); *G01R 33/028* (2013.01); *H04W 4/008* (2013.01); *H04W 24/08* (2013.01); *H04M 1/7253* (2013.01); *H04M 2250/12* (2013.01); *H04W 84/12* (2013.01)

(58) Field of Classification Search
CPC ..... H04W 48/08; H04W 4/008; H04W 24/08; H04W 84/12; G01B 7/003
See application file for complete search history.

(56) References Cited

U.S. PATENT DOCUMENTS 6,937,998 B1    8/2005    Swartz et al.
7,162,250 B2    1/2007    Misra
(Continued)

FOREIGN PATENT DOCUMENTS

EP         2521342          11/2012
WO    WO 2014/128703       8/2014

OTHER PUBLICATIONS

International Preliminary Report on Patentability Dated Sep. 3, 2015 From the International Bureau of WIPO Re. Application No. PCT/IL2014/050180.
(Continued)

*Primary Examiner* — Martin Mushambo

(57) ABSTRACT

A method of detecting a proximity to a target device. The method comprises scanning a wireless network frequency band in a personal mobile device to discover at least one wireless network signal, triggering, in response to a discovery of the at least one wireless network signal, a magnetic field scan of a magnetometer operated by the personal mobile device, detecting, in the personal mobile device, according to the magnetic field scan, a presence or an absence of a magnetic field signature associated with a predefined proximity to a target device.

16 Claims, 5 Drawing Sheets

(51) Int. Cl.
G01B 7/00 (2006.01)
G01R 33/028 (2006.01)
H04W 24/08 (2009.01)
H04M 1/725 (2006.01)
H04W 84/12 (2009.01)

(56) References Cited

U.S. PATENT DOCUMENTS

| | | | | |
|---|---|---|---|---|
| 2004/0229621 | A1* | 11/2004 | Misra | H04W 16/08 |
| | | | | 455/445 |
| 2012/0128172 | A1 | 5/2012 | Alden | |
| 2012/0284427 | A1* | 11/2012 | Dods | H04W 88/00 |
| | | | | 710/3 |
| 2013/0035039 | A1 | 2/2013 | Piemonte et al. | |

OTHER PUBLICATIONS

International Search Report and the Written Opinion Dated Jun. 16, 2014 From the International Searching Authority Re. Application No. PCT/IL2014/050180.

Written Opinion and Search Report Dated Feb. 11, 2016 From the Intellectual Property Office of Singapore Re. Application No. 11201506535X.

Written Opinion Dated Oct. 4, 2016 From the Intellectual Property Office of Singapore Re. Application No. 11201506535X. (7 Pages).

* cited by examiner

PROXIMITY DETECTION

RELATED APPLICATIONS

This application is a National Phase of PCT Patent Application No. PCT/IL2014/050180 having International filing date of Feb. 18, 2014, which claims the benefit of priority under 35 USC §119(e) of U.S. Provisional Patent Application No. 61/767,273 filed on Feb. 21, 2013. The contents of the above applications are all incorporated by reference as if fully set forth herein in their entirety.

FIELD AND BACKGROUND OF THE INVENTION

The present invention, in some embodiments thereof, relates to methods and systems for establishing communication between electronic devices and, more particularly, but not exclusively, to methods and systems for identifying conditions for data transfer based on estimated proximity.

There are several wireless communication protocols to make a data transfer connection between two devices, for example a wireless local area network (WLAN) protocol, such as the IEEE 802.11 Standard, also known as Wi-Fi™, wireless personal area network (WPAN) protocol, such as the IEEE 802.15 Standard, also known as Bluetooth™, and IEEE 802.15.4 Standard, also known as ZigBee™. These protocol allow peer-to-peer direct connections between devices.

Another protocol that may be used for exchange of data between the portable device and the external device in short ranges, for example less than 20 centimeters (cm), is a near field communication (NFC) protocol. NFC uses magnetic field induction, where one loop antenna in one device comes sufficiently close to another loop antenna in another device, effectively forming an air-core transformer in which data is transferred between the two devices.

SUMMARY OF THE INVENTION

According to some embodiments of the present invention, there is provided a method of detecting a proximity to a target device. The method comprises scanning a wireless network frequency band in a personal mobile device to discover at least one wireless network signal, triggering, in response to a discovery of the at least one wireless network signal, a magnetic field scan of a magnetometer operated by the personal mobile device, and detecting, in the personal mobile device, according to the magnetic field scan, a presence or an absence of a magnetic field signature associated with a predefined proximity to a target device.

Optionally, the at least one wireless network signal comprises a plurality of wireless network signals from a plurality of different transmitting units which are physically detached from the target device.

Optionally, the at least one wireless network signal comprises at least one beacon signal.

Optionally, the magnetic field signature includes a direction or magnitude which varies over time.

Optionally, the magnetic field signature is a change of at least about 100 micro Tesla (µT).

Optionally, the method comprises conducting, in response to the detection of the presence, a data transfer between the personal mobile device and the target device.

Optionally, the method comprises conducting, in response to the detection of the presence, an event in the personal mobile device.

Optionally, the method comprises conducting, in response to the detection of the presence, a data transfer between the personal mobile device and a remote device.

More optionally, the method comprises acquiring an identifier of the target device according to an analysis of at least one of the at least one wireless network signal and the magnetic field signature; wherein the data transfer is in a data transfer session selected from a plurality of data transfer sessions according to the identifier.

More optionally, the method comprises a identifying a current orientation of the personal mobile device; wherein the conducting is performed if the current orientation matches a desired orientation.

More optionally, the method comprises a identifying a current location of the personal mobile device; wherein the conducting is performed if the current location matches a desired location.

Optionally, the triggering comprises measuring strength of the at least one wireless network signal and performing the triggering accordingly.

Optionally, the scanning comprises transmitting a plurality of inquiry messages to induce at least one response from at least one transmitting unit which generates the at least one wireless network signal.

According to some embodiments of the present invention, there is provided a personal mobile device that comprises a processor, a wireless network interface which performs a wireless network scan of a wireless network frequency band to detect at least one wireless network signal, a magnetometer, and an control module which operates the magnetometer to perform a magnetic field scan in response to a discovery of the at least one wireless network signal and determines using the processor whether a predefined proximity to a target device is identified according to the magnetic field scan.

Optionally, the system further comprises a data transfer module which participates, in response to the detection of the predefined proximity, in a data transfer session wherein data is transferred between the personal mobile device and the target device.

Optionally, the personal mobile device is a cellular device and the magnetometer and the wireless network interface are integrated components of the cellular device.

According to some embodiments of the present invention, there is provided a system for allowing personal mobile devices to detect being in a predefined proximity with target devices. The system comprises a plurality of signal transmitting units which are distributed in a monitored space, the plurality of signal transmitting units having a plurality of transmission areas forming a plurality of overlapping transmission coverage areas in the monitored space, a plurality of target devices which are distributed among the plurality of overlapping transmission coverage areas, each the target device having a magnet generating a magnetic field signature, and a plurality of control modules which are installed in a plurality of personal mobile devices, each the control module operates a respective the personal mobile device to identify a combination of wireless signals from the plurality of signal transmitting units and to identify accordingly one of the a plurality of overlapping transmission coverage areas, each the control module operates a magnetometer of the respective personal mobile device to conduct a magnetic field scan in response the identification of the combination of wireless signals and to identify accordingly a respective the magnetic field signature associated with one of the plurality of target devices Optionally, the magnetic field signature changes over time.

Optionally, the magnet is an electromagnet; each the target device in a certain overlapping transmission coverage area operates a respective the electromagnet to generate a certain magnetic field signature which is different from any magnetic field signature of any the target device which is located in the overlapping transmission coverage area. Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system.

In an exemplary embodiment of the invention, one or more tasks according to exemplary embodiments of method and/or system as described herein are performed by a data processor, such as a computing platform for executing a plurality of instructions.

Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF EMBODIMENTS OF THE INVENTION

Figure 1:
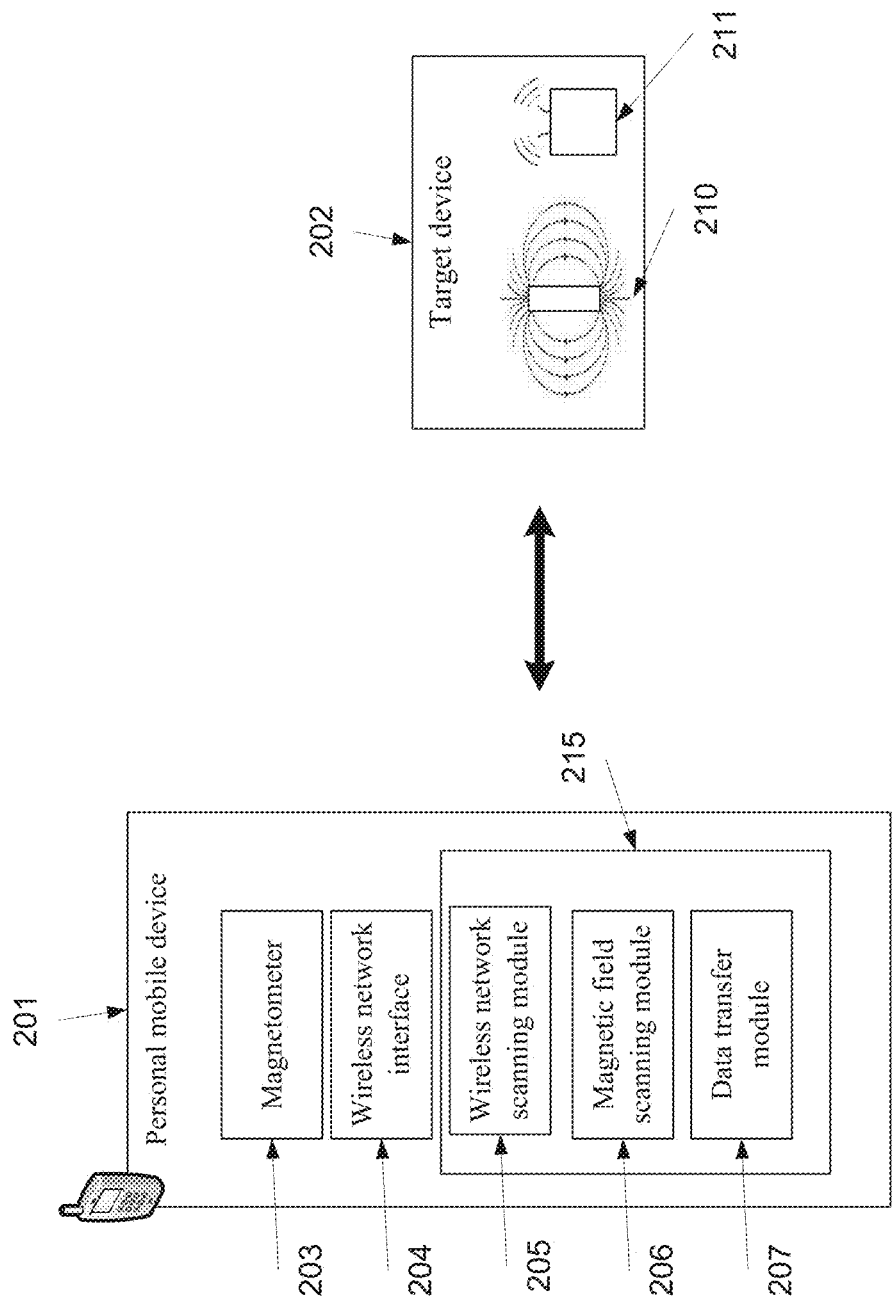
FIG. 1 is a flowchart of proximity detection process which may be used for data transfer, according to some embodiments of the present invention.

The present invention, in some embodiments thereof, relates to methods and systems for establishing communication between electronic devices and, more particularly, but not exclusively, to methods and systems for identifying conditions for data transfer based on estimated proximity.

According to some embodiments of the present invention, there are methods and systems of detecting a proximity between a personal mobile device, such as a cellular phone and a target device, such as a terminal, based on a magnetic field detection triggered in response to a discover of one or more wireless network signals, optionally in a desired strength. This proximity detection may be used as a sign for establishing a data transfer session between the personal mobile device and the target device and/or a remote device, for example for approving transaction(s), receiving information pertaining to product(s) located nearby, selecting object(s) and/or the like. The wireless network signals may be WPAN and/or WLAN signals, for example as exemplified below.

According to some embodiments of the present invention, there are methods and systems of using an arrangement of wireless network signal transmitting units deployed in a monitored space to create overlapping transmission coverage areas which indicate to personal mobile devices when to initiate a magnetic field scan for identifying magnetic field signatures of target devices located in the overlapping transmission coverage areas.

Optionally, different target devices have different magnetic field signatures, for example generated by electromagnets which are operated to generate magnetic field signatures based on different patterns.

Optionally, these methods and systems allow deploying low cost target devices without integrated wireless network signal transmitting units, reducing the cost of distributing target devices in a monitored space.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Reference is now made to FIG. 1, which is a flowchart 100 of proximity estimation process wherein a magnetic field detection is triggered in response to a discover of a wireless network signal, optionally in a desired strength, and used as a sign proximity between a personal mobile device and a target device, optionally for establishing a data transfer session, according to some embodiments of the present invention. The personal mobile device means a mobile client terminal, such as a cellular device, a tablet, a Smartphone, a pair of smart glasses, and/or any other personal communication device. A communication device means a personal mobile device or a device used to interface with personal mobile devices, for example a beacon, a reader, a detection chip, a reading station, a computing unit and/or the like. The communication device, also referred to as a target device, may be portable or non-portable, for example a fixed device such as a desktop personal computer and a wireless access point. The method 100 is based on using a magnetometer identifies a magnetic field and operated to detect a certain magnetic field signature, for example a magnetic field magnitude change (or disturbance) of about 140-160 micro Tesla (µT) units, for example at least about 100 T over a period, for instance 150 µT, for example during less than 6 seconds, for instance during less than 2 seconds and/or magnetic field direction change, for example by an electromagnet. For brevity, a magnetic field magnitude change may refer to a magnetic field disturbance. Such a magnetic field magnitude change may be an outcome of a material with magnetic influence such as metal, optionally a magnet or electromagnet placed in proximity and/or in the target device and generating the certain magnetic field signature, for instance when distance thereto is decreased. For brevity, a magnet is used herein to describe an element generating a magnetic field.

A process during which readings of the magnetometer are processed to detect the magnetic field signature is optionally triggered in response to the detection of a wireless network signal, optionally in a desired strength and/or from an identified transmitter. The magnetic field signature may thus be read in a process that is automatically triggered in response to the detection of a wireless network signal indicative of the proximity of a target network device. The wireless network signal may be a wireless network signal having an strength above a predefined threshold, for example having a strength of more than −55 db, for example above −22 db. The personal mobile device may scan for wireless network signals periodically, for instance, every second, 2 second, 10 seconds, 1 minute or any intermediate or shorter period.

The detection of the magnetic field signature is indicative of a desired proximity between the personal mobile device and the target device, for example less than 20 cm, 10 cm, 1 cm, or any intermediate or smaller distance. After the magnetic field signature is detected and therefore proximity is estimated, a data transfer session may be initiated. The data transfer session may be on a wireless network connection. For example, a WPAN protocol may be initiated by personal mobile device and the target device. The created connection may be a peer-to-peer connection. The connection may be used for a unidirectional data transfer, for example of identification (ID) and/or authentication data, for instance for payments. The connection may be used for a bidirectional data transfer, for example data related to interactive communication. Optionally, the method 100 implemented as a programmed processor with firmware or software.

Figure 2:
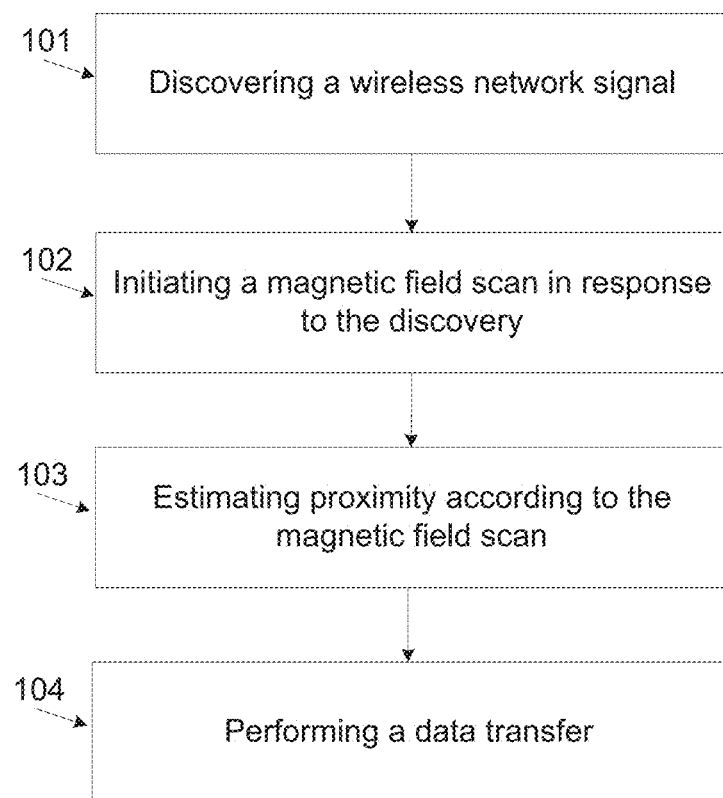
FIG. 2 is a schematic illustration of an exemplary personal mobile device which detects proximity with an exemplary target device, for example by implementing the proximity detection process of FIG. 1, according to some embodiments of the present invention.

Reference is now also made to FIG. 2, which is a schematic illustration of an exemplary personal mobile device 201 which estimates a proximity to an exemplary target device 202, according to some embodiments of the present invention, for example for establishing a data transfer session therewith. The exemplary target device 202 is optionally a payment terminal, an entrance terminal, a proximity identifier terminal, a data receiving terminal, and/or a data transmitting terminal. The exemplary target device 202 may be implemented by a computing unit, such as a laptop, a desktop, Smartphone, a tablet, an access point, a router, and/or the like.

The exemplary target device 202 includes a magnetic component 210, such a magnet or electromagnet, which generates magnetic field, for example a fixed magnetic field or a variable magnetic field. The exemplary target device 202 includes a wireless network module 211 which transmits a wireless network, such as an inquiry message for establishing a connection, a response to an inquiry message for establishing a connection, a beacon signal and/or the like. The personal mobile device 201 includes a magnetometer 203, also referred to as a digital compass module, a compass integrated circuit (IC), for instance a BMC150 eCompass module for battery-driven mobile devices, such as Smartphones, tablet computers and watches which the specification thereof is incorporated herein by reference. The magnetometer 203 is designed to perform a magnetic field scan, detecting a presence and/or an absence of a magnetic field signature indicative of a proximity to a target device.

The personal mobile device 201 includes a wireless network interface 204 that is set to perform a wireless network scan of a wireless network frequency band to detect a wireless network signal. For example, the wireless network interface 204 may be a Bluetooth™ module, a WiFi module, a ZigBee™ module and/or the like. The exemplary personal mobile device 201 further includes a wireless network scanning module 205, for example an application or a software, which is set to analyze readings of the wireless network interface 204 and to discover accordingly the presence and/or absence of a wireless network signal from the target device 202 according to the wireless network scan. Optionally, only wireless network signals having strength above a certain threshold or within a certain range are analyzed. In such a manner, only devices 202 within a certain range from the exemplary personal mobile device 201 are discoverable. For example, only if the strength of the wireless network signal is above a predefined threshold, for example above −55 db, for example above −22 db, the wireless network interface 204 is discovered. The target device 202 further includes a magnetic field scanning module 206, for example a software module and/or an application, which triggers the initiation of a magnetic field scan, held by the magnetometer 203, in response to a discovery of the target device by the wireless network scanning module 205. The magnetic field scanning module 206 analyzes the magnetic field scan, for example as described below, and determine accordingly whether a predefined proximity is identified. The personal mobile device 201 further includes a data transfer module 207 which performs, in response to the detection of said predefined proximity, a data transfer between the personal mobile device 201 and target devices 202 or another remote device. The data transfer module 207 may be a software module, for example an application. Optionally, the wireless network scanning module 205 the magnetic field scanning module 206, and the data transfer module 207 are part of an application installed in the personal mobile device 201, for example an operating system functionality, an app store application, and/or the like, for example functionalities of a control module 215. Components 203-207 are optionally integrated in the housing of the personal mobile device 201.

As depicted in reference numeral 101 of FIG. 1, in use, the personal mobile device 201 scans a wireless network frequency band, for example using the wireless network interface 204, to discover a wireless network signal from a target device, such as 202. The wireless network signal may be a beacon signal that is sent continuously, iteratively, and/or sequentially, by the target device 202. The wireless network signal may an inquiry message sent by the target device 202 to induce responses from the personal mobile device 201, or vice versa, a response to an inquiry message sent by the personal mobile device 201. For example, the wireless network interface 204 is operated in an inquiry phase, inviting other devices to form a piconet. This solicits responses from other devices. The target device 202, which is optionally configured to be willing to join a piconet respond to the wireless network interface 204's solicitation. In the inquiry phase, the wireless network interface 204 may solicit responses by transmitting a standard packet, called identifier (ID) packets, on different hop channels (i.e., on different frequencies), and listens for response packets, such as frequency hopping sequence (FHS) packets, from the target device 202. The target device 202 puts its own address and clock values in the packet. Receiving an FHS packet by the personal mobile device 201 indicates that the target device 202 is willing form a piconet with the personal mobile device 201.

Optionally, the desired wireless network signal is determined according to the location of the personal mobile device 201. The location of the personal mobile device 201 is optionally acquired from a global positioning system (GPS) and/or cellular positioning module that are integrated therein. In such embodiment, a list that associates between different geographical locations and different wireless network signal may be used, indicating which wireless network signal should be in different geographical locations. The list may be updated from time to time, for example with the location of different terminals, such as payment terminals.

Now, as shown at 102, if the target device 201 is discovered, for example in response to the identification of a wireless network signal which includes its ID, a magnetic field scan of the magnetometer 203 operated by the personal mobile device 201 to detect a presence or an absence of a magnetic field signature associated with a predefined proximity to the target device 202. The magnetic field signature is optionally a change in the magnitude (i.e. an increase) of at least about 100 µT, for example about 150 µT, over a period, for example during less than 3 seconds, and/or a change in the direction of the magnetic field signature. For example, a magnitude change indicates that the personal mobile device 201 is brought near to the target device 202 or vice versa. The magnetic field signature may also be a change in magnitude and/or direction which is controlled by an electromagnet, for example according to a pattern indicative of a proximity to a certain target device. In one example, a magnetic field signature is defined by a change in direction during a period, for example in a certain tempo or frequency As shown at 103, the personal mobile device 201 may now estimate, according to the magnetic field, whether the predefined proximity to the target device 202 is achieved.

Optionally, the personal mobile device 201 may also estimate the orientation of the personal mobile device 201, for example as sensed or measured by an accelerometer, a gyroscope and/or any other orientation detection sensor which is integrated in the housing of the personal mobile device 201. Additionally or alternatively, the personal mobile device 201 may also estimate the location of the personal mobile device 201, for example using a global positioning system (GPS) and/or cellular positioning module. In such embodiments, in addition to the predefined proximity, matching with a desired orientation and/or location may be estimated. For example, an estimation whether the personal mobile device 201 is in a certain orientation, for example parallel or perpendicular to the ground or not and/or whether the personal mobile device 201 is in a certain geographical area may be estimated.

Now, as shown at 104, a data transfer between the personal mobile device 201 and the target device 202 or a remote device may be performed in response to the detection of the predefined proximity and optionally the location and/or orientation of the personal mobile device 201. The data transfer session may include identification of a unique ID of the devices, authentication, handshake procedure, negotiation procedure, transfer speed adaptation, and/or the like. The identity of the target device 202 optionally dictates which data transfer session is established, for example an information session wherein data is forwarded to the personal mobile device, a payment session wherein a transaction is approved on behalf of a user associated with the personal mobile device, a selection session wherein a selection of an object is approved on behalf of the user, and/or a presence session indicating that the user was in a certain location, for example with a time clock terminal that register arrival to work and/or a parking lot.

Figure 3:
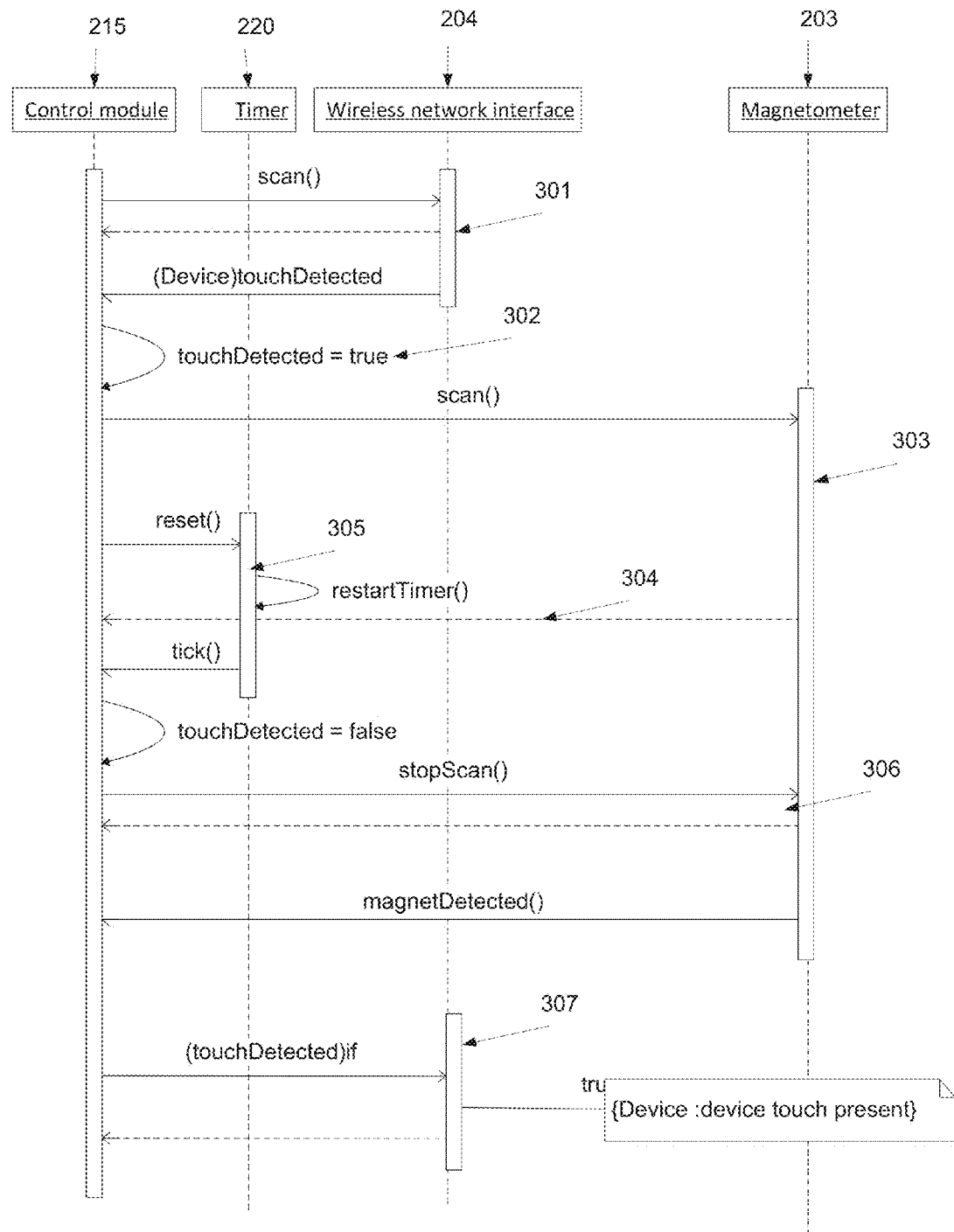
FIG. 3 is a sequence chart depicting communication behavior of a control module of a personal mobile device with a network interface, a magnetometer, and a timer of the personal mobile device, according to some embodiments of the present invention.

Reference is now also made FIG. 3, which is a sequence chart depicting communication behavior of a control module of the personal mobile device 201, such as 215, with the network interface 204, the magnetometer 203, and a timer 220 of the personal mobile device 201, according to some embodiments of the present invention.

First, as shown at 301, the control module 215 instructs the wireless network interface 204 to search for a wireless network signal, for example an inquiry message or a response to an inquiry message, for instance according to Bluetooth™ protocol. The wireless network signal may be analyzed to extract a unique ID of the transmitting party, verifying that it is actually the target device 202. Then, as shown at 302, if the wireless network signal is detected (marked herein as a touchDetected( ) function) and optionally verified, a proximity to the target device 202 is induced (marked herein by a touchDetected flag). When the wireless network signal is detected, a magnetic field scan is initiated, as shown at 303. If during a certain period, as shown at 305, a magnetic field signature is identified, for example as shown by 304, an realization of a desired proximity to the target device 202 is estimated, for example a distance of less than 20 cm, 10 cm, 1 cm, or any intermediate or smaller distance. After the period ends, the scan may be halt 306. As shown at 307, if a magnetic field signature is detected proximity notification is presented to the user of the personal mobile device 201 and/or to a user of the target device 202. For example, when the target device 202 is a payment terminal, a user interface (UI) that allows the user of the personal mobile device 201 to approve a quote is presented on the screen of the personal mobile device 201, preferably with the quote that is acquired from the target device 202, for instance during a data transfer session that is established between the personal mobile device 201 and the target device 202.

According to some embodiments of the present invention, a proximity to a target device having a magnetic component is estimated by an analysis of a combination of wireless network signals originated from a number of different signal transmitting units, for example beacons or access points. For example, reference is now also made to FIG. 4, which is a schematic illustration of a plurality of signal transmitting units, such as 401, distributed in a monitored space 400, according to some embodiments of the present invention.

Figure 5:
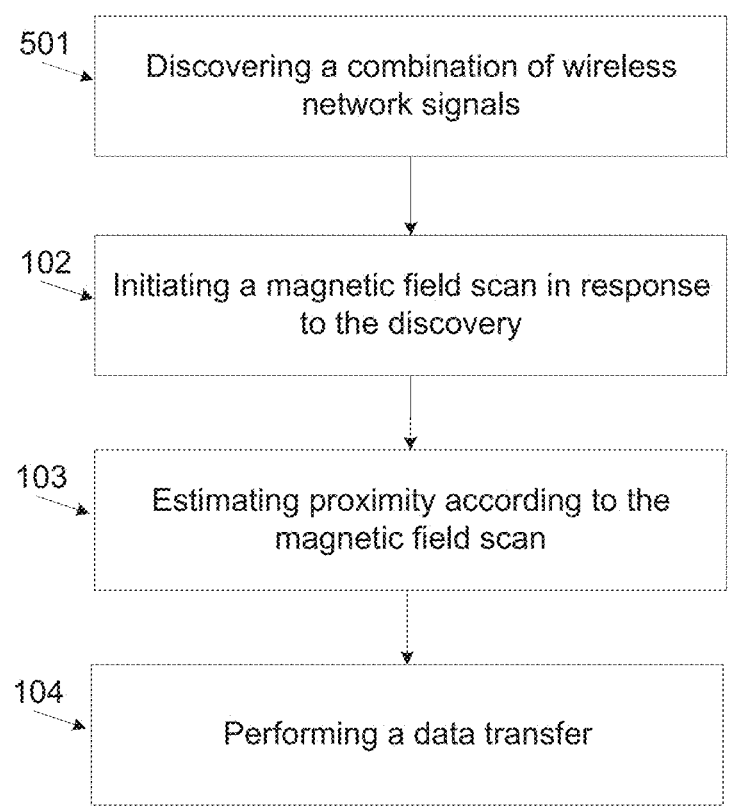
FIG. 5 is a flowchart of proximity detection process wherein a magnetic field scan is initiated in response to the detection of a combination of wireless network signals, according to some embodiments of the present invention.

The different signal transmitting units have overlapping transmission coverage areas, for example as shown at 402 which is an overlapping transmission coverage area of signals from signal transmitting units 401, 411, and 412. The signal transmitting units are physically detached from the target device. This allows identifying a proximity to a target device 403 with a magnetic component deployed in the area 400 according to the combination of wireless network signals. For example, FIG. 5 is a flowchart of a proximity detection process wherein a magnetic field scan is initiated in response to the detection of a combination of wireless network signals, according to some embodiments of the present invention. 102-103 and optional 104 are as described above with reference to FIG. 2; however, 101 of FIG. 2 is replaced with 502 that indicates the magnetic field scan is initiated in response to the detection of a combination of wireless network signals and not just in response to the detection of a single wireless network signal. Optionally, the personal mobile device 201 hosts and/or accesses a dataset associating between combinations of wireless network signals, for example unique ID of beacons which is encoded in the wireless network signals, for example in a Bluetooth protocol messages, and target devices, for example payment terminals. In use, when a certain combination of wireless network signals is identified, the magnetic field scan is triggered to identify a desired proximity to a target device.

Figure 4:
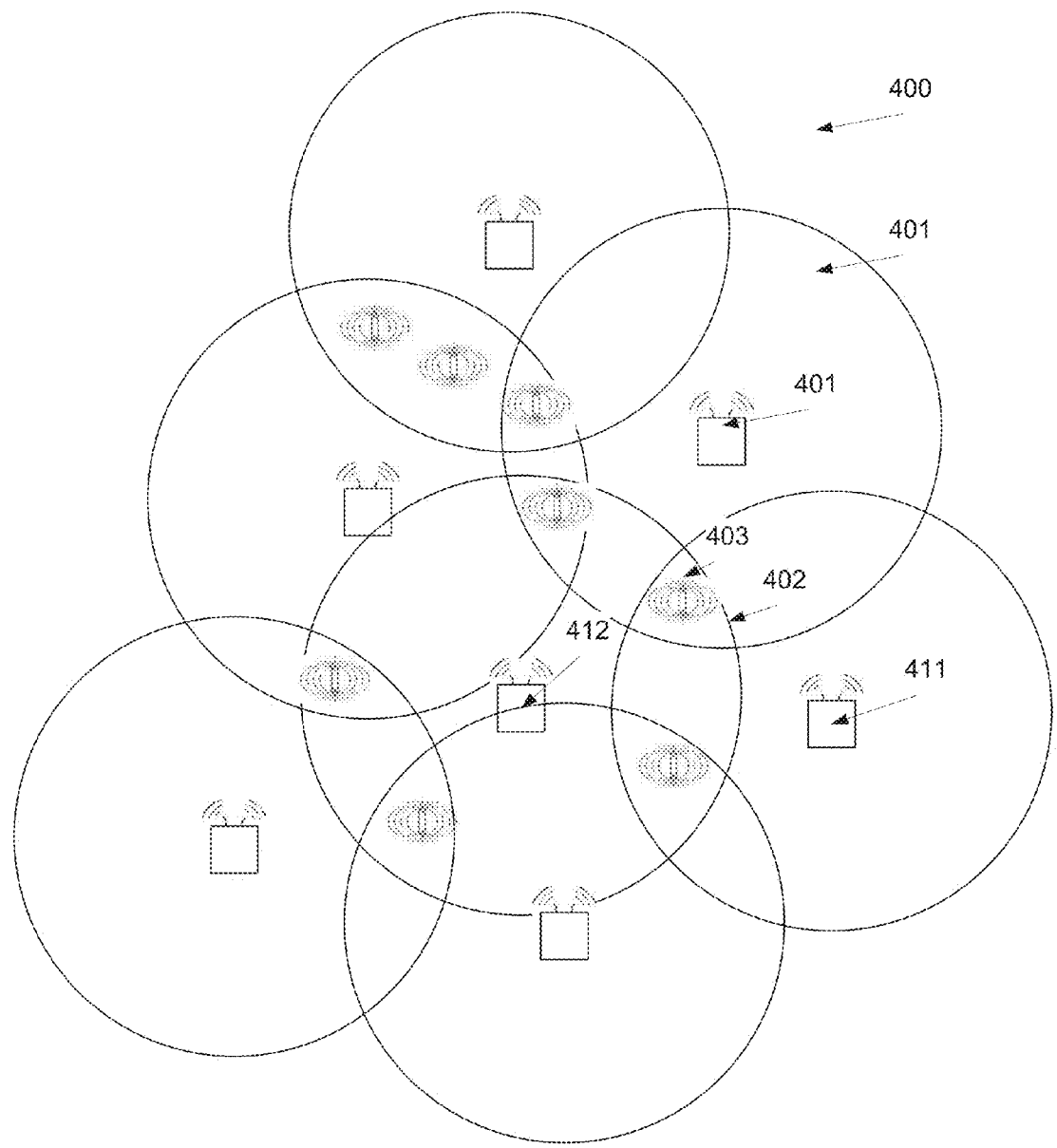
FIG. 4 is a schematic illustration of a plurality of signal transmitting units distributed in a monitored space, according to some embodiments of the present invention.

Optionally, a number of target devices are deployed in the same overlapping transmission coverage area, namely in an area where the same combination of wireless network signals from different transmitting units is identified when a wireless network scan is conducted. In such embodiments, each target device in this area is set to generate a different magnetic field signature, for example using an electromagnet and the personal mobile device 201 hosts and/or accesses a dataset associating between each of a plurality of combinations of wireless network signals and a set of magnetic field signatures of different target devices, for example different information terminals. In such embodiments, an electromagnet of each target device in a certain overlapping transmission coverage area generates a magnetic field having a pattern that varies over time. In use, when the combination of wireless network signals in the certain overlapping transmission coverage area is detected, a magnetic field scan is initiated. Detected magnetic field change(s) are recorded and matched with the patterns documented in the dataset. A match between the recorded magnetic field and a certain pattern of the patterns is indicative of a proximity to the target device associated with the certain pattern. In an exemplary embodiment, signal transmitting units are deployed in a space, for example a commercial space, forming a set of overlapping transmission coverage areas. In each overlapping transmission coverage area, one or more target devices are deployed, for example information terminals set to transmit information about products placed in a certain subspace, for example a shelf and/or payment terminals, such as point of sale terminals set to perform a transaction with the user of the personal mobile device. A personal mobile device of a user who is in the space, executes iteratively a communication establishment process, for example as depicted in FIG. 4. The target device detects events wherein the user locates her personal mobile device in proximity to a selected target device by identifying combinations of wireless network signals that trigger the identification of respective magnetic field signatures. In each event, a suitable data transfer session is triggered, for example an information session wherein information about a certain product presented on the display of the personal mobile device, a selection session wherein a certain product is selected for purchasing by the user in response to the detected event, and/or a payment session wherein a payment for selected and/or otherwise designated product(s) is made by the user in response to the detected event.

It should be noted that deploying transmitting units, for example as depicted in FIG. 4 allows using a number of transmitting units to cover an area that include a much larger number of target devices. For example, three transmitting units may be used to cover an area with more than 8 target devices. This allows numerous personal mobile devices to establish data transfer sessions, optionally simultaneously, with selected target devices that do not have a transmitting unit, such as a wireless network module.

In such embodiments, the deployment costs are relatively low as the target devices do not have to be equipped with transmitting units to allow a detection of proximity thereto.

It is expected that during the life of a patent maturing from this application many relevant systems and methods will be developed and the scope of the term a mobile device, a terminal, and a module is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of detecting a proximity to a target device, comprising:
   scanning a wireless network frequency band in a personal mobile device to discover at least one wireless network signal encoded according to a wireless personal area network (WPAN) protocol or a wireless local area network (WLAN) protocol;
   triggering, in response to a discovery of said at least one wireless network signal, a magnetic field scan of a magnetometer operated by said personal mobile device; and
   detecting, in said personal mobile device, according to said magnetic field scan, a presence or an absence of a magnetic field signature associated with a predefined proximity to the target device;
   wherein said magnetic field signature is a change of at least 100 micro Tesla (µT).

2. The method of claim 1, wherein said at least one wireless network signal comprises a plurality of wireless network signals from a plurality of different transmitting units which are physically detached from said target device.

3. The method of claim 1, wherein said at least one wireless network signal comprises at least one beacon signal.

4. The method of claim 1, wherein said magnetic field signature includes a direction or magnitude which varies over time.

5. The method of claim 1, further comprising conducting, in response to the detection of said presence, a data transfer between said personal mobile device and said target device.

6. The method of claim 5, further comprising acquiring an identifier of said target device according to an analysis of at least one of said at least one wireless network signal and said magnetic field signature; wherein said data transfer is in a data transfer session selected from a plurality of data transfer sessions according to said identifier.

7. The method of claim 5, further comprising identifying a current orientation of said personal mobile device; wherein said conducting is performed if said current orientation matches a desired orientation.

8. The method of claim 5, further comprising identifying a current location of said personal mobile device; wherein said conducting is performed when said current location matches a desired location.

9. The method of claim 1, further comprising conducting, in response to the detection of said presence, an event in said personal mobile device.

10. The method of claim 1, further comprising conducting, in response to the detection of said presence, a data transfer between said personal mobile device and a remote device.

11. The method of claim 1, wherein said triggering comprises measuring strength of said at least one wireless network signal and performing said triggering accordingly.

12. The method of claim 1, wherein said scanning comprises transmitting a plurality of inquiry messages to induce at least one response from at least one transmitting unit which generates said at least one wireless network signal.

13. A non-transitory computer readable medium comprising computer executable instructions adapted to perform the method of claim 1.

14. A personal mobile device, comprising:
   a processor;
   a wireless network interface which performs a wireless network scan of a wireless network frequency band to detect at least one wireless network signal encoded according to a wireless personal area network (WPAN) protocol or a wireless local area network (WLAN) protocol;
   a magnetometer; and
   a control module which operates said magnetometer to perform a magnetic field scan for detecting a magnetic field signature in response to a discovery of said at least one wireless network signal and determines using said processor whether a predefined proximity between the personal mobile device and a target device is identified according to said magnetic field scan;
   wherein said magnetic field signature is a change of at least 100 micro Tesla (µT).

15. The system of claim 14, further comprising a data transfer module which participates, in response to the detection of said predefined proximity, in a data transfer session wherein data is transferred between said personal mobile device and said target device.

16. The system of claim 14, wherein said personal mobile device is a cellular device and said magnetometer and said wireless network interface are integrated components of said cellular device.

* * * * *